United States Patent [19]

Sugawara

[11] 4,301,420
[45] Nov. 17, 1981

[54] FREQUENCY CHARACTERISTIC-ADJUSTING APPARATUS

[75] Inventor: Tsutomu Sugawara, Yokohama, Japan

[73] Assignee: Tokyo Shibaura Denki Kabushiki Kaisha, Kawasaki, Japan

[21] Appl. No.: 90,107

[22] Filed: Nov. 1, 1979

[30] Foreign Application Priority Data

Nov. 9, 1978 [JP] Japan ................................ 53-137322

[51] Int. Cl.³ .............................................. H03F 3/68
[52] U.S. Cl. ................................... 330/126; 330/295; 330/305; 330/306
[58] Field of Search .............. 330/126, 151, 107, 295, 330/305, 306; 328/167

[56] References Cited

U.S. PATENT DOCUMENTS

| | | | |
|---|---|---|---|
| 2,760,011 | 8/1956 | Berry | 330/126 |
| 3,769,611 | 10/1973 | Scaggs | 330/126 |
| 4,032,857 | 6/1977 | Lum | 328/167 |
| 4,137,510 | 1/1979 | Iwahara | 330/126 |

FOREIGN PATENT DOCUMENTS 5313860 2/1978 Japan .

OTHER PUBLICATIONS

Philips Data Sheet, TCA 740A, Oct. 1978.

*Primary Examiner*—James B. Mullins
*Assistant Examiner*—Gene Wan
*Attorney, Agent, or Firm*—Oblon, Fisher, Spivak, McClelland & Maier

[57] ABSTRACT

A frequency characteristic-adjusting apparatus comprising a filter circuit formed of a first variable gain amplifier and a capacitor, a second variable gain amplifier for amplifying an output signal from the filter circuit, an amplifier for amplifying a signal denoting a difference between the amplitudes of an input signal to the filter circuit and an output signal therefrom, and an adder circuit for adding together output signals from the second variable gain amplifier and difference signal amplifier, and wherein the first and second gain amplifiers are connected to potentiometers, and the gains of the first and second variable gain amplifiers are varied in accordance with changes in the voltage supplied from the potentiometers to the amplifiers, while maintaining the prescribed relationship between the gains of the first and second variable gain amplifiers.

10 Claims, 8 Drawing Figures

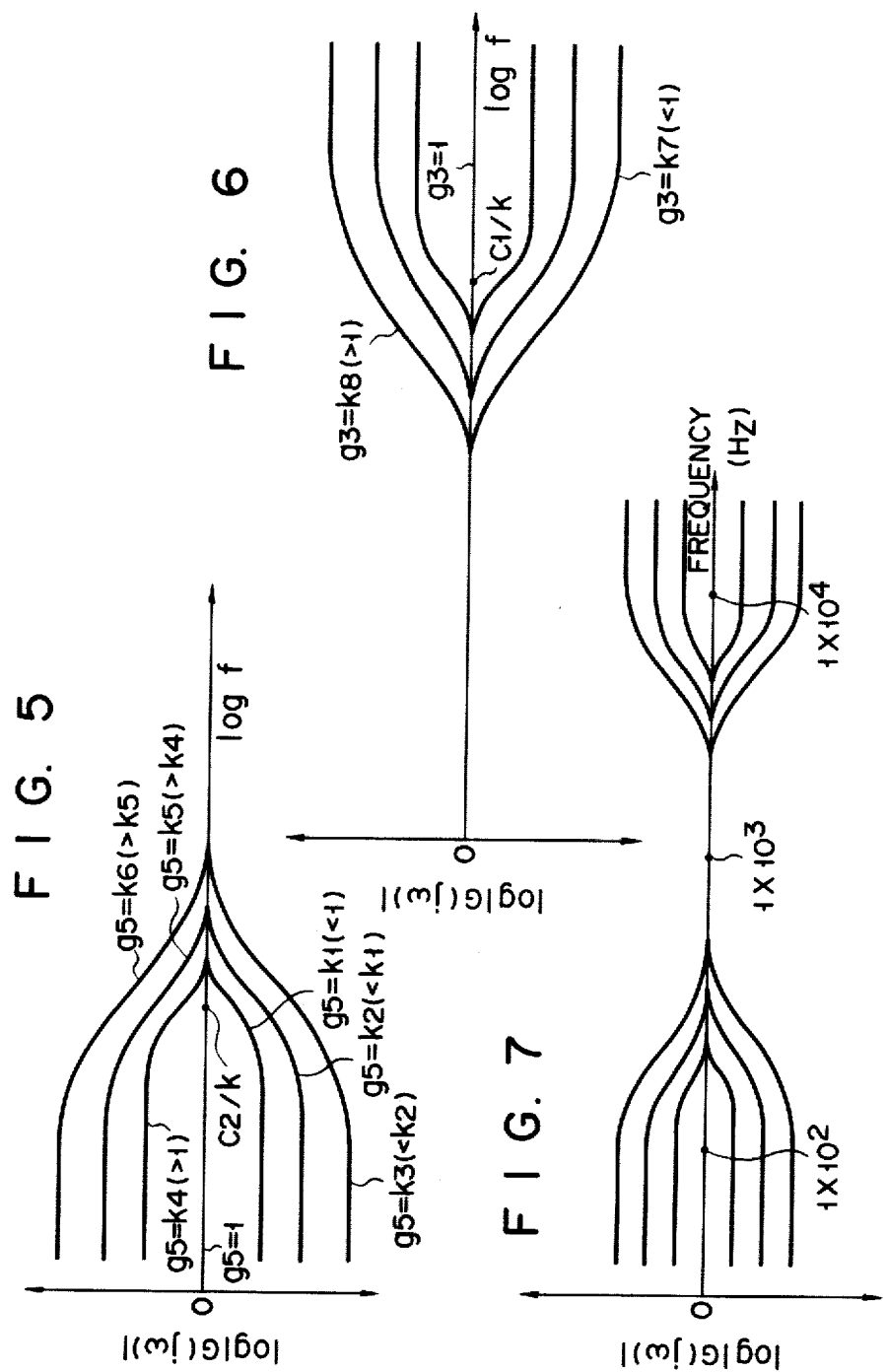

FREQUENCY CHARACTERISTIC-ADJUSTING APPARATUS

This invention relates to a frequency characteristic-adjusting apparatus used in, for example, an audio amplifier circuit.

A frequency characteristic-adjusting apparatus has a variable frequency characteristic to increase or decrease the amplitude of sound signals falling, for example, within the range of low or high frequencies. The prior art frequency characteristic-adjusting apparatus comprises a filter circuit formed of a variable resistor and capacitor in order to provide the desired frequency characteristic between one of the input terminals and the output terminal of a differential amplifier, the other input terminal being supplied with an input signal. With the known frequency characteristic-adjusting apparatus of the above-mentioned type, it has been considered necessary to connect together the variable resistor and the main part of the frequency characteristic-adjusting apparatus by means of a long transmission cable. In this case, however, the transmission cable which transfers a signal whose frequency characteristic is to be adjusted, must be sealed in order to suppress the occurrence of an undesirable event such as the generation of noises. Consequently, the conventional frequency characteristic-adjusting apparatus has the drawbacks that extra capacitors and inductors have to be provided, thus reducing the property of the frequency characteristic-adjusting apparatus.

It is accordingly the object of this invention to provide a frequency characteristic-adjusting apparatus which is so arranged as to prevent a signal whose frequency characteristic is to be adjusted from being transferred through a transmission cable disposed between the operation section and main part of the frequency characteristic-adjusting apparatus.

According to an aspect of this invention, there is provided a frequency characteristic-adjusting apparatus which comprises a filter circuit provided with variable impedance means for adjusting a cut-off frequency; first amplifier means for amplifying a signal corresponding to an output signal from the filter circuit; second amplifier means for amplifying a signal corresponding to a difference between an input signal supplied to the filter circuit and an output signal issued therefrom; and adder means for adding together output signals from the first and second amplifier means, and wherein at least one of the first and second amplifier means is formed of variable gain-amplifying means which is connected to the impedance means, and whose gain is controlled in accordance with the change in the impedance of the impedance means.

This invention can be more fully understood from the following detailed description when taken in conjunction with the accompanying drawings, in which:

FIG. 1 is a circuit diagram of a frequency characteristic-adjusting apparatus embodying this invention;

FIG. 2 indicates the frequency characteristics of output signals from voltage-controlled amplifiers used in the frequency characteristic-adjusting circuit of FIG. 1;

FIG. 5 illustrates the frequency characteristic of the total gain in the low frequency range, as measured by applying a parameter constituted by the gain of the voltage-controlled amplifier which is used to amplify an output signal from the low-pass filter of the frequency characteristic-adjusting circuit;

FIG. 6 shows the frequency characteristic of the total gain in the high frequency range of the frequency characteristic-adjusting circuit, as measured by applying a parameter constituted by the gain of the voltage-controlled amplifier which is used to amplify a signal corresponding to an output signal from the high-pass filter of the frequency characteristic-adjusting circuit;

Figure 1:
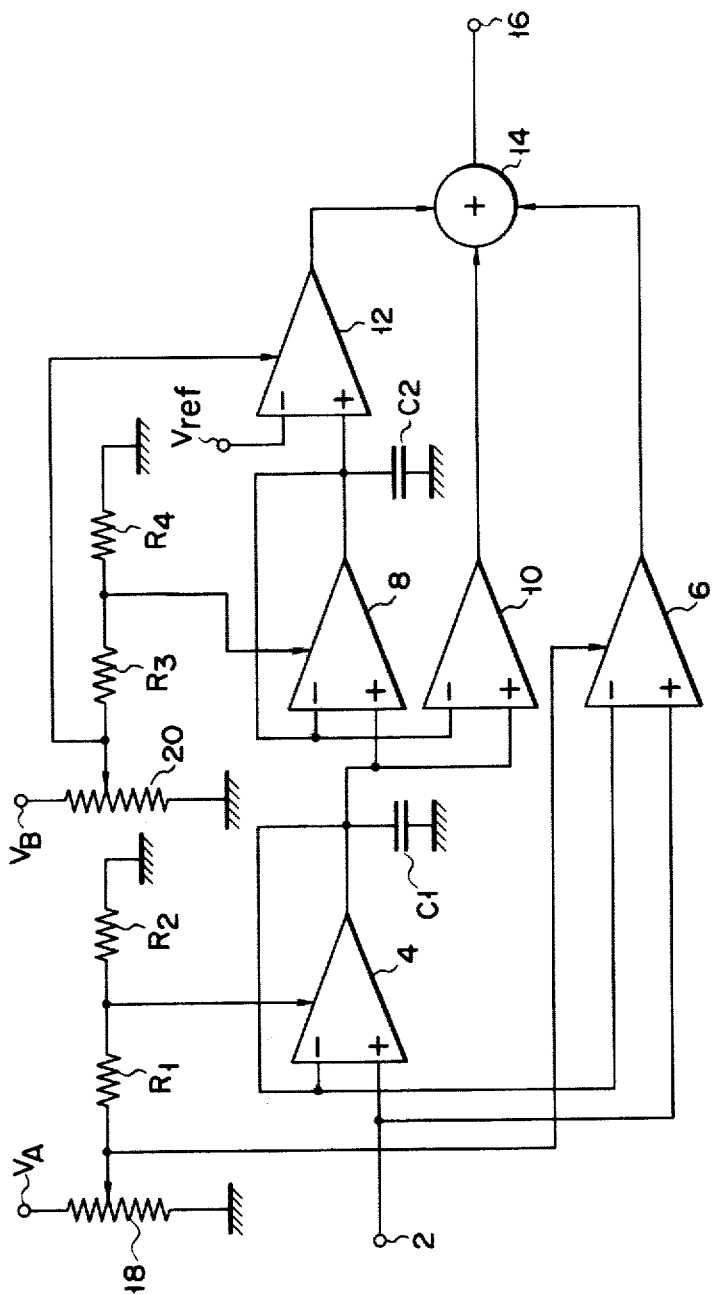
Figure 8:
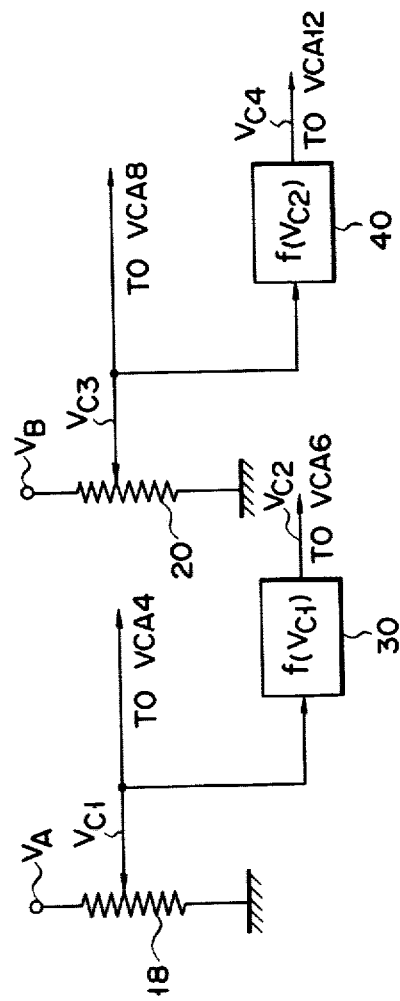

FIG. 7 indicates the frequency characteristic of the total gain of the frequency characteristic-adjusting circuit having the frequency characteristics of both FIGS. 5 and 6; and FIG. 8 illustrates a modification of a gain control voltage-generating circuit used with the frequency characteristic-adjusting circuit of FIG. 1.

Referring to FIG. 1 showing the arrangement of a frequency characteristic-adjusting circuit embodying this invention, an input signal supplied to the input terminal 2 is connected to the noninverting input terminals of variable gain amplifiers or voltage-controlled amplifiers (VCAs) 4 and 6. The inverting terminals of the VCAs 4 and 6 are connected to the output terminal of the VCA 4. The output terminal of the VCA 4 is grounded through a capacitor C1, and is also connected to the noninverting terminals of the VCA 8 and amplifier 10. The output terminal of the VCA 8 is connected to the inverting input terminals of the VCA 8 and amplifier 10. The output terminal of the VCA 8 is grounded through a capacitor C2, and also connected to the noninverting input terminal of a VCA 12. The inverting input terminal of the VCA 12 is connected to a referential voltage terminal $V_{ref}$. The output terminals of the VCAs 6 and 12 and amplifier 10 are connected to the input terminals of an adder 14, whose output signal is conducted to the output terminal 16 of the frequency characteristic-adjusting circuit.

The gains of the VCAs 4 and 6 are controlled by a first gain control section which is formed of a potentiometer 18 connected to a power supply terminal $V_A$ and resistors R1 and R2 connected in series between the movable contact of the potentiometer 18 and the ground. The gains of the VCAs 8 and 12 are controlled by a second control section which is formed of a potentiometer 20 connected to a power supply terminal $V_B$ and resistors R3 and R4 connected in series between the movable contact of the potentiometer 20 and the ground.

Figure 2:
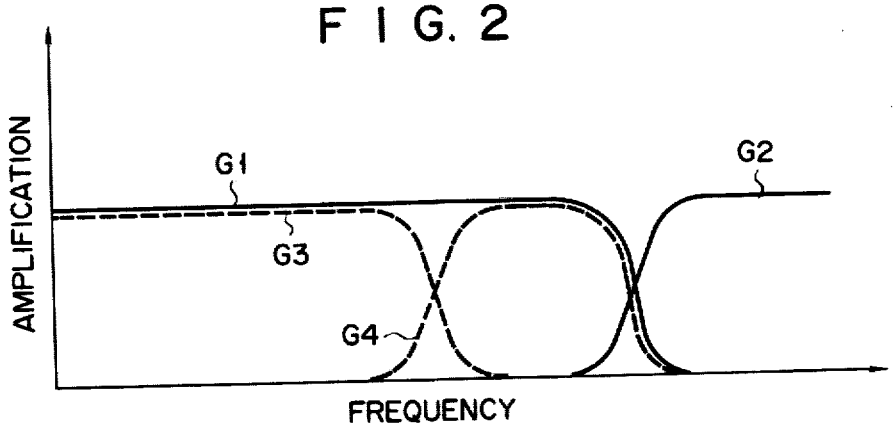

There will now be described the fundamental operation of the frequency characteristic-adjusting circuit of FIG. 1 by reference to FIG. 2 illustrating various frequency characteristics.

Where an input signal $V_{IN}$ supplied to the input terminal 2 has an insufficiently high frequency to render the capacitor C1 conducting in the AC mode, then an output signal V4 from the VCA 4 is amplified in accordance with the magnitude of the gain of the VCA 4. Conversely, where the input signal $V_{IN}$ has a sufficiently high frequency to render the capacitor C1 conducting in the A.C. mode, then an output signal V4 from the VCA 4 has an amplitude of zero level. The output signal from the VCA 4 shows a frequency characteristic indicated in a solid line G1 in FIG. 2. The VCA 4 and capacitor C1 jointly constitute a first low-pass filter.

The VCA 6 which is supplied with an input signal $V_{IN}$ to the VCA 4 and output signal V4 therefrom amplifies a signal corresponding to the difference obtained by subtracting the output signal V4 from the input signal $V_{IN}$, namely, amplifies a signal component obtained by removing the lower frequency range of the input signal $V_{IN}$. Therefore, an output signal V6 from the VCA 6 displays a frequency characteristic shown in a solid line G2 in FIG. 2. In other words, the VCA 6 generates an output signal having the same frequency characteristic as an output signal generated from a high-pass filter which has received the input signal $V_{IN}$.

With the gain of the VCA 4 represented by g1, then an input signal $V_{IN}(j\omega)$ to the VCA 4 and an output signal $V4(j\omega)$ therefrom have a relationship expressed by the following equations:

$$V4(j\omega) = \frac{g1}{g1 + j\omega C1} \cdot V_{IN}(j\omega) \quad (1)$$

$$V_{IN}(j\omega) - V4(j\omega) = \frac{j\omega C1}{g1 + j\omega C1} \cdot V_{IN}(j\omega) \quad (2)$$

The VCA 8 and capacitor C2 jointly form a second low-pass filter, as in the same manner as the VCA 4 and capacitor C1 collectively constitute a first low-pass filter. The first and second low-pass filters are cascade-connected to each other. The first and second capacitors C1 and C2 are so designed as to cause the cut-off frequency of the second low-pass filter to be set at a lower level than that of the first low-pass filter. Therefore, an output signal V8 from the VCA 8 displays a frequency characteristic indicated in a broken line G3 in FIG. 2. An amplifier 10 supplied with an input signal V4 to the VCA 8 and an output signal V8 therefrom amplifies a signal corresponding to the difference obtained by subtracting the output signal V8 from the input signal V4. Therefore, an output signal V10 from the amplifier 10 displays a frequency characteristic indicated in a broken line G4 in FIG. 2. In other words, the amplifier 10 sends forth an output signal having the same frequency characteristic as an output signal from a band-pass filter which has received the input signal $V_{IN}$.

With the gain of the VCA 8 denoted by g2, then an input signal $V4(j\omega)$ to the VCA 8 and an output signal $V8(j\omega)$ therefrom have a relationship expressed by the following equations:

$$V8(j\omega) = \frac{g2}{g2 + j\omega C2} \cdot V4(j\omega) \quad (3)$$

$$V4(j\omega) - V8(j\omega) = \frac{g1}{g1 + j\omega C1} \cdot \frac{j\omega C2}{g2 + j\omega C2} \cdot V_{IN}(j\omega) \quad (4)$$

The VCA 12 which is supplied with an output signal V8 from the VCA 8 and reference signal $V_{ref}$ generates an output signal V12 which corresponds to the output signal V8. Accordingly, the output signal V12 displays a frequency characteristic shown in a broken line G3 in FIG. 2. In other words, the VCA 12 produces a signal having the same frequency characteristic as an output signal from the low-pass filter which processes an input signal $V_{IN}$. An output signal V12 from the VCA 12, output signal V6 from the VCA 6 and output signal V10 from the amplifier 10 are added together in the adder circuit 14. As a result, the adder circuit 14 sends forth an output current $I_{OUT}(j\omega)$ expressed by the following equation:

$$I_{OUT}(j\omega) = g3 \cdot \{V_{IN}(j\omega) - V4(j\omega)\} + g4\{V4(j\omega) - V8(j\omega)\} + g5\{V8(j\omega)\} \quad (5)$$

where g3, g4 and g5 respectively denote the gains of the VCA 6, amplifier 10 and VCA 12.

From the equations of (2) to (5), the total gain $G(j\omega)$ of the frequency characteristic-adjusting circuit of FIG. 1 may be expressed as follows:

$$G(j\omega) = \frac{I_{OUT}(j\omega)}{V_{IN}(j\omega)} = \frac{j\omega C1}{g1 + j\omega C1} \cdot g3 + \frac{g1}{g1 + j\omega C1} \cdot \frac{j\omega C2}{g2 + j\omega C2} \cdot g4 + \frac{g1}{g1 + j\omega C1} \cdot \frac{g2}{g2 + j\omega C2} \cdot g5 \quad (6)$$

As apparent from the equation (6), the frequency characteristic of the total gain $G(j\omega)$ can be freely defined by adjusting the gains g3 and g5 respectively of the VCAs 6 and 12.

Where, for example, the gains g3 and g5 respectively of the VCAs 6 and 12 are made equal to the gain g4 of the amplifier 10, then the total gain $G(j\omega)$ becomes equal to the gain g3 and remains constant regardless of changes in the frequency. In other words, the frequency characteristic of the total gain $G(j\omega)$ shows an accurately flat pattern. Where the gain g3 of the VCA 6 is increased, then the total gain $G(j\omega)$ is elevated in the high frequency range. Where the gain g5 of the VCA 12 is increased, then the total gain $G(j\omega)$ grows larger in the low frequency range.

Where $|j\omega C1|$ is made to have a fully smaller value than $|j\omega C2|$, then the total gain $G(j\omega)$ is approximated by the following equation in the low frequency range:

$$G(j\omega) = \frac{j\omega C2}{g2 + j\omega C2} \cdot g4 + \frac{g2}{g2 + j\omega C2} \cdot g5 \quad (7)$$

Therefore, the absolute value of the total gain $G(j\omega)$ in the low frequency range is expressed as follows:

$$|G(j\omega)| = g5 \times \left| \frac{1 + (j\omega C2 \cdot g4/g2 \cdot g5)}{1 + (j\omega C2/g2)} \right| \quad (8)$$

Figure 3:
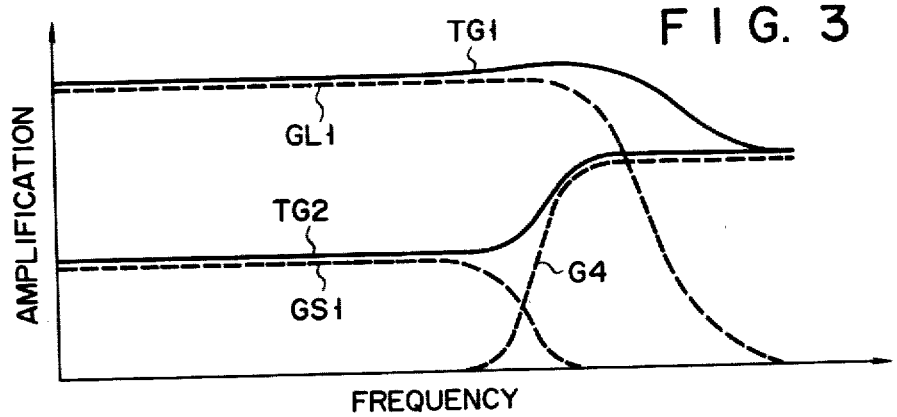
FIG. 3 shows the frequency characteristic in the low frequency range of the total gain of the frequency characteristic-adjusting circuit of FIG. 1, which is observed when changes are made in the gain of a voltage-controlled amplifier for amplifying an output signal from a low-pass filter.

Where, in the above equation (8), g2 and g4 are fixed, and only g5 is varied, then the frequency characteristic of the total gain $|g(j\omega)|$ has a pattern shown in FIG. 3. Namely, where, in FIG. 3, the gain g5 of the VCA 12 is chosen to be larger than the gain g4 of the amplifier 10, then an output signal from the VCA 12 has a frequency characteristic indicated in a broken line GL1 in FIG. 3. The total gain $G(j\omega)$ displays a frequency characteristic shown in a solid line TG1 in FIG. 3. The broken line G4 of FIG. 3 denotes the frequency characteristic of an output signal V10 from the amplifier 10. Where the gain g5 of the VCA 12 is chosen to be smaller than the gain g4 of the amplifier 10, then an output signal V12 from the VCA 12 displays a frequency characteristic shown in a broken line GS1 in FIG. 3. The total gain $G(j\omega)$ shows a frequency characteristic indicated in a solid line TG2 in FIG. 3 in the low and medium frequency range.

As seen from FIG. 3, the frequency characteristic of the total gain $G(j\omega)$ obtained at the time of g5 > g4 has a pattern asymmetric to the pattern of the frequency characteristic of the total gain $G(j\omega)$ obtained at the time of $g5 > g4$ with respect to the flat frequency characteristic of the total gain produced at the time of $g5 = g4$. Under such condition, the frequency characteristic-adjusting circuit fails to be applied as a tone-controlling circuit.

Figure 4:
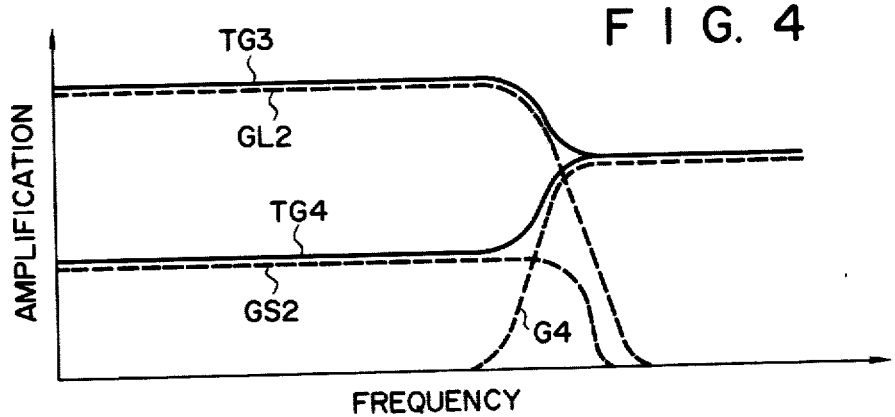
FIG. 4 shows the frequency characteristic in the low frequency range of the total gain of the frequency characteristic-adjusting circuit improved by varying the cut-off frequency of the low-pass filter.

With this invention, therefore, the cut-off frequency of the second filter circuit is changed by letting the gain g2 of the VCA 8 vary with the gain g5 of the VCA 12. In other words, where the gain g5 of the VCA 12 is increased, the gain g2 of the VCA 8 is decreased to reduce the cut-off frequency of the second filter circuit as indicated in a broken line GL2 in FIG. 4. As a result, an output signal from the VCA 12 has a frequency characteristic indicated in a broken line GL2 in FIG. 4, and the total gain $G(j\omega)$ displays a frequency characteristic having a pattern indicated in a solid line TG3 in FIG. 4. Where, on the other hand, the gain g5 of the V12 is decreased, the gain g2 of the VCA 8 is increased to elevate the cut-off frequency of the second filter circuit. In this case, an output signal from the VCA 12 has a frequency characteristic shown in a broken line GS2 in FIG. 4, and the total gain $G(j\omega)$ displays a frequency characteristic TG4 symmetric with the solid frequency characteristic TG3 of FIG. 4.

To attain the above-mentioned effect, the VCA 8 of the frequency characteristic-adjusting circuit of FIG. 1 is so designed that as a higher voltage is impressed on the control terminal, the gain g2 of the VC8 grows smaller. The VCA 12 of the frequency characteristic-adjusting circuit of FIG. 1 is so designed that as the higher voltage is applied to the control terminal, the gain g5 is more increased.

Assume now that where the potentiometer 20 is operated, the gains g2 and g5 respectively of the VCAs 8 and 12 have such a value as satisfies the following equation:

$$g2 = (g5/g4) - \frac{1}{2} \cdot k \quad (9)$$

where k is a constant.

Where, in the above-mentioned case, the gain g5 is varied, with the gain g4 set at 1, then the equation (8) can be rewritten as follows:

$$|G(j\omega)| = g5 \times \left| \frac{1 + j\omega C2/k \sqrt{g5}}{1 + j\omega C2 \sqrt{g5}/k} \right| \quad (10)$$

FIG. 5 shows the frequency characteristic of the total gain $G(j\omega)$ expressed by the equation (10) as measured by plotting the logarithmic value of $|G(j\omega)|$ on the ordinate and the logarithmic value of the frequency f on the abscissa and using g5 as a parameter. As seen from FIG. 5, showing frequency characteristics, the total gain $G(j\omega)$ has a flat pattern in the case of $g5 = 1$. The frequency characteristics arising when the gain g5 is progressively reduced to k1, k2 and k3 are rendered symmetric with those which are produced when the gain g5 is progressively increased to k4, k5 and k6. The frequency characteristics of FIG. 5 can be provided by designing, for example, the VCA 8 to let its gain vary proportionately to the voltage impressed on the control terminal and designing the VCA 12 to let its gain vary in inverse proportion to the square of voltage applied to the control terminal.

The frequency characteristic of the total gain $G(j\omega)$ in the high frequency range can be adjusted in the same manner as the frequency characteristic of the total gain $G(j\omega)$ in the low frequency range. For instance, the gains g1 and g3 respectively of the VCAs 4 and 6 can be so controlled by the potentiometer 18, resistors R1 and R2 as to satisfy the following equation:

$$g1 = (g3/g4)\frac{1}{2} \cdot k \quad (11)$$

In this case, for example, the gain of the VCA 4 is designed to vary in proportion to the voltage impressed on the control terminal. The gain of VCA 6 is designed to vary in proportion to the square of the voltage applied to the control terminal. As a result, the total gain $G(j\omega)$ in the high frequency range displays a frequency characteristic as shown in FIG. 6.

Where the VCAs 4, 6, 8 and 12 are so arranged as to provide the frequency characteristics shown in FIGS. 5 and 6, then the frequency characteristic of the total gain $G(j\omega)$ can be so adjusted as is illustrated in FIG. 7 by operating the potentiometers 18 and 20.

This invention has been described by reference to the foregoing embodiment. However, it will be noted that the invention is not limited thereto. Namely, the amplifier 10 used with the embodiment of FIG. 1 may be replaced by a VCA to adjust the frequency characteristic of the total gain in the medium frequency range. In this case, however, the gains of the VCAs 4 and 8 have to be changed in the prescribed relationship with the variation of the gain of the substituent VCA.

Further, as shown in FIG. 8, the resistors R1, R2, R3 and R4 may be replaced by function generators 30 and 40, thereby supplying the VCAs 4 and 6 with voltage whose levels have the prescribed relationship with each other, and also the VCAs 8 and 12 with voltage whose levels similarly have the prescribed relationship with each other. In this case, the gains of the VCAs 4, 6, 8 and 12 are so arranged as to vary in proportion to the D.C. voltages respectively impressed on the control terminals. The function generators 30 and 40 should advisably be so arranged as to cause the following equations to result in order to satisfy the previously mentioned equations (9) and (11).

$$V_{C2} = f(V_{C1}) = KV^2_{C1} \quad (12)$$

$$V_{C4} = f(V_{C3}) = K/V^2_{C3} \quad (13)$$

where $V_{C1}$ denotes a D.C. voltage supplied from the potentiometer 18 to the VCA 4 and function generator 30, $V_{C2}$ a D.C. voltage supplied from the function generator 30 to the VCA 6, $V_{C3}$ a D.C. voltage supplied from the potentiometer 20 to the VCA 8 and function generator 40, $V_{C4}$ a D.C. voltage supplied from the function generator 40 to the VCA 12, and K a constant.

In short, it is advised that where the frequency characteristic of the total gain $G(j\omega)$ in the high frequency range is to be adjusted, the gains of the VCAs 4 and 6 be varied while the prescribed relationship is maintained therebetween; and where the frequency characteristic of the total gain $G(j\omega)$ in the low frequency range is to be adjusted, then the gains of the VCAs 8 and 12 be changed while the prescribed relationship is maintained therebetween. This arrangement ensures the satisfactory adjustment of the frequency characteristic of the total gain $G(j\omega)$.

In the frequency characteristic-adjusting circuit of FIG. 1, two filters are used. However, it is possible to provide a single filter, that is, connect the output terminal of the VCA 4 directly to the noninverting input terminal of the VCA 12 or apply three filters.

What is claimed is:

1. A frequency characteristic-adjusting apparatus comprising:

gain control signal means, a filter circuit having capacitive means and variable impedance means, the impedance of said variable impedance means being varied in accordance with an output control signal from said control signal generating means to adjust a cut-off frequency of said filter circuit;

first amplifier means for amplifying a signal corresponding to an output signal from said filter circuit;

second amplifier means for amplifying a signal corresponding to a difference between an input signal to said filter circuit and an output signal therefrom; and adder means for adding together output signals from said first and second amplifier means, wherein at least one of said first and second amplifier means is connected to said gain control signal means and is formed of a variable gain amplifier circuit whose gain is controlled in accordance with change in an output control signal from said gain control signal means.

2. The frequency characteristic-adjusting apparatus according to claim 1, in which said variable impedance means is formed of third amplifier means whose gain is controlled in accordance with change in an output control signal from said gain control signal means.

3. The frequency characteristic-adjusting apparatus according to claim 2, wherein said filter circuit is a low-pass filter, and the gain of said first amplifier means varies in accordance with change in an output control signal from said gain control signal, means, while maintaining the prescribed relationship between the gains of said first and third amplifier means.

4. The frequency characteristic-adjusting apparatus according to claim 3, wherein the gain of said first amplifier means is varied in accordance with an output control signal from said gain control signal means and in proportion to the square of the gain of said third amplifier means.

5. A frequency characteristic-adjusting apparatus comprising:

gain control signal means;

a plurality of cascade-connected filter circuits at least one of which includes capacitive means and variable impedance means, the impedance of said variable impedance means being varied in accordance with an output control signal from said control signal generating means to adjust the cut-off frequency of a corresponding one of said filter circuits;

first amplifier means for amplifying a signal corresponding to an output signal from the last one of said filter circuits;

a plurality of second amplifier means for amplifying signals each corresponding to a difference between the input signal and output signal of a corresponding one of said filter circuits; and adder means for adding together output signals from said first and second amplifier means, wherein at least one of said first and second amplifier means is connected to said gain control signal means and is formed of a variable gain amplifier circuit whose gain is controlled in accordance with change in an output control signal from said gain control signal means.

6. The frequency characteristic-adjusting apparatus according to claim 5, wherein the last one of said filter circuits includes third amplifier means which is connected to said gain control signal means and whose gain is controlled in accordance with change in an output control signal from said gain control signal means.

7. The frequency characteristic-adjusting apparatus according to claim 6, wherein the last one of said filter circuits is a low-pass filter, and the gain of the first amplifier means is varied in accordance with change in an output control signal from said gain control signal means, while maintaining the prescribed relationship between the gains of said first and third amplifier means.

8. The frequency characteristic-adjusting apparatus according to claim 7, wherein the gain of the first amplifier means is varied in inverse proportion to the square of the gain of said third amplifier means.

9. The frequency characteristic-adjusting apparatus according to claim 5, wherein the first one of said filter circuits includes third amplifier means which is connected to said gain control signal means.

10. The frequency characteristic-adjusting apparatus according to claim 9, wherein the gain of that one of said plurality of second amplifier means which is connected to the first one of said filter circuits is varied in accordance with an output control signal from said gain control signal means and in proportion to the square of the gain of said third amplifier means.

* * * * *